United States Patent
Oya et al.

(10) Patent No.: US 10,340,217 B2
(45) Date of Patent: Jul. 2, 2019

(54) SEMICONDUCTOR DEVICE INCLUDING A CYLINDRICAL ELECTRODE INSERTED INTO A LOOPED PORTION OF AN ELECTRODE

(71) Applicant: Mitsubishi Electric Corporation, Tokyo (JP)

(72) Inventors: Daisuke Oya, Tokyo (JP); Satoshi Yokota, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/797,027

(22) Filed: Oct. 30, 2017

(65) Prior Publication Data

US 2018/0247888 A1 Aug. 30, 2018

(30) Foreign Application Priority Data

Feb. 24, 2017 (JP) .................. 2017-034029

(51) Int. Cl.
| | |
|---|---|
| H01L 23/50 | (2006.01) |
| H01L 23/053 | (2006.01) |
| H01L 23/498 | (2006.01) |
| H01L 23/00 | (2006.01) |
| H01R 4/30 | (2006.01) |
| H01R 4/48 | (2006.01) |
| H01R 4/56 | (2006.01) |
| H01R 12/70 | (2011.01) |
| H01R 4/06 | (2006.01) |

(52) U.S. Cl.
CPC ............ *H01L 23/50* (2013.01); *H01L 23/053* (2013.01); *H01L 23/49838* (2013.01); *H01L 24/34* (2013.01); *H01L 2224/48091* (2013.01); *H01L 2224/48227* (2013.01); *H01R 4/06* (2013.01); *H01R 4/308* (2013.01); *H01R 4/48* (2013.01); *H01R 4/56* (2013.01); *H01R 12/7076* (2013.01)

(58) Field of Classification Search
CPC .. H01L 23/50; H01L 23/52; H01L 2224/4809
See application file for complete search history.

(56) References Cited

U.S. PATENT DOCUMENTS

| | | | |
|---|---|---|---|
| 9,209,114 B2 * | 12/2015 | Yoo .................. | H01L 24/96 |
| 10,020,237 B2 * | 7/2018 | Hoehn ............... | H01L 23/053 |
| 2009/0268416 A1 * | 10/2009 | Kanda .............. | H05K 7/142 361/752 |
| 2014/0246768 A1 | 9/2014 | Soyano | |

FOREIGN PATENT DOCUMENTS

| | | |
|---|---|---|
| JP | 2001-036001 A | 2/2001 |
| WO | 2013/084589 A1 | 6/2013 |

* cited by examiner

*Primary Examiner* — Quoc D Hoang
(74) *Attorney, Agent, or Firm* — Studebaker & Brackett PC

(57) ABSTRACT

A semiconductor device includes a semiconductor chip, an electrode electrically connected to the semiconductor chip, the electrode including a looped portion, a cylindrical electrode including a main portion having a screw thread formed therein and a narrow portion continuous with the main portion, the narrow portion having a smaller width than the main portion, the cylindrical electrode being electrically connected to the electrode by the narrow portion being inserted into the looped portion, and a case for the semiconductor chip and the electrode, the case contacting the main portion while causing the screw thread and a connecting portion between the looped portion and the cylindrical electrode to be exposed.

11 Claims, 9 Drawing Sheets

SEMICONDUCTOR DEVICE INCLUDING A CYLINDRICAL ELECTRODE INSERTED INTO A LOOPED PORTION OF AN ELECTRODE

BACKGROUND

Field

The present invention relates to a semiconductor device used to, for example, control a motor of an electric railroad device or an automotive device and a method for manufacturing the semiconductor device.

Background Art

FIG. 17 of Japanese Patent Application Publication No. 2001-36001 discloses electrode terminals 18, 20, and 22 used to electrically connecting a semiconductor chip and the outside of a module. One end of each electrode terminal is secured to a control circuit pattern such as an emitter circuit pattern, a collector circuit pattern, or a gate by soldering or ultrasonic bonding, and the other end of the electrode terminal is exposed on the top surface of the module and bent. In most cases, a screw is passed through the other end of the electrode terminal, and screwed into a nut buried in a case, thus securing a control driver located outside the module to the module.

In the technique disclosed in Japanese Patent Application Publication No. 2001-36001, the electrode needs to be bent outside the case of the module and positioned on the nut. This bending step complicates the manufacture of a semiconductor device. In particular, since a hole of the bent electrode and a hole of the nut need to coincide with each other, there is a problem that misalignment failures may occur, depending on bending accuracy. Further, in the case where an electrode is bent, the electrode naturally needs to have a bend allowance. Accordingly, the area of a portion of the electrode which is exposed on the outside of the device increases by an amount corresponding to the bend allowance. This necessarily leads to a short insulating distance and creates an obstacle to the miniaturization of the product.

Power modules used in highly public markets such as the electric-railroad or electricity market require high reliability. Specifically, connection between a control board having a control driver portion formed therein and a semiconductor device containing a semiconductor chip requires connection using a screw and a nut, not an easy connecting structure such as a press-fit structure.

FIG. 1 and the like of International Patent Application Publication No. WO2013/084589 disclose a semiconductor device which includes an outside case 20 containing a semiconductor element 23, a circuit substrate 10 having a control circuit 11 mounted thereon, and a metal component 30. The metal component 30 includes a first attaching portion 31a, a second attaching portion 32a, and a bus bar 33a. The first attaching portion 31a attaches the circuit substrate 10 to the outside case 20, and is connected to a ground pattern of the circuit substrate 10 at the time of attaching. The second attaching portion 32a attaches an external device to the outside case 20, and is grounded at the time of attaching. The bus bar 33a connects the first attaching portion 31a and the second attaching portion 32a.

It is demanded that a semiconductor device suitable for miniaturization is provided by a simple method. However, the semiconductor device disclosed in Japanese Patent Application Publication No. 2001-36001 requires the bending of electrodes extending to the outside of the device and therefore is not suitable for the miniaturization of the device. Moreover, the semiconductor device disclosed in International Patent Application Publication No. WO2013/084589 requires complicated connection within the case and therefore cannot be easily manufactured.

SUMMARY

Some examples described herein may provide a semiconductor device which is suitable for miniaturization and which can be easily manufactured and a method for manufacturing the semiconductor device.

In some examples, a semiconductor device includes a semiconductor chip, an electrode electrically connected to the semiconductor chip, the electrode including a looped portion, a cylindrical electrode including a main portion having a screw thread formed therein and a narrow portion continuous with the main portion, the narrow portion having a smaller width than the main portion, the cylindrical electrode being electrically connected to the electrode by the narrow portion being inserted into the looped portion, and a case for the semiconductor chip and the electrode, the case contacting the main portion while causing the screw thread and a connecting portion between the looped portion and the cylindrical electrode to be exposed.

In some examples, a semiconductor device manufacturing method includes a first preparation of placing a cylindrical electrode including a main portion and a narrow portion continuous with the main portion on a lower mold half, the narrow portion having a smaller width than the main portion, to cause the main portion to contact the lower mold half, a second preparation of placing an electrode including a looped portion on the lower mold half to house part of the narrow portion in the looped portion and to cause the narrow portion to protrude from the looped portion upward, a mold clamping of clamping an upper mold half and the lower mold half together to compress with the upper mold half a portion of the narrow portion which protrudes from the looped portion upward, thus forming a wide portion spreading over the looped portion, and a resin injection of injecting resin into a cavity surrounded by the upper mold half and the lower mold half to cause the resin to contact a side surface of the main portion.

Other features will be revealed below.

BRIEF DESCRIPTION OF THE DRAWINGS

FIG. 3 is a cross-sectional view showing the cylindrical electrode and the like;

FIG. 4 is a plan view showing the cylindrical electrode and the like;

FIG. 5 is a bottom view showing the looped portion, the cylindrical electrode, and the like;

FIG. 7 is a cross-sectional view showing the electrode placed on the lower mold half and the like;

FIG. 8 is a cross-sectional view showing an upper mold half and the lower mold half clamped together and the like;

DETAILED DESCRIPTION

Semiconductor devices and semiconductor device manufacturing methods according to embodiments of the present invention will be described with reference to the drawings. The same or corresponding components will be denoted by the same reference signs, and the repetition of explanation thereof may be omitted.

Embodiment 1

Figure 1:
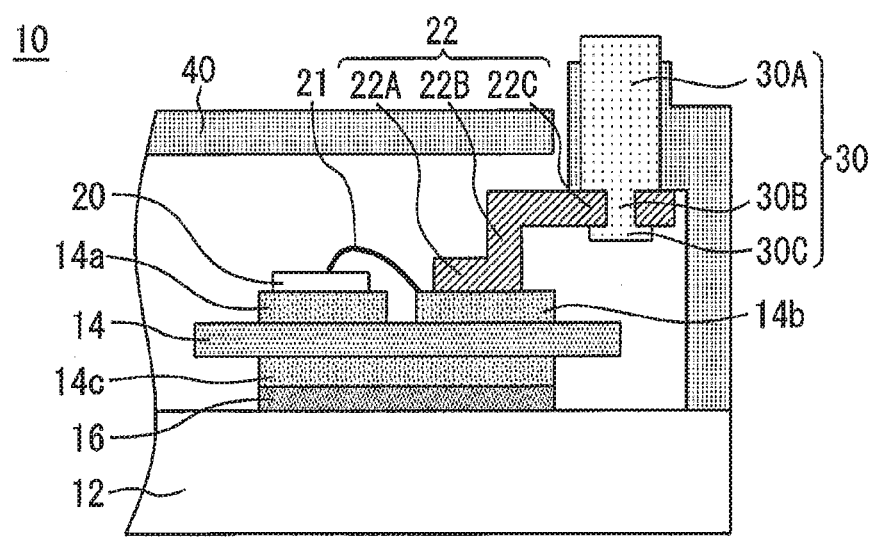
FIG. 1 is a cross-sectional view of a semiconductor device according to Embodiment 1.

FIG. 1 is a cross-sectional view of a semiconductor device 10 according to Embodiment 1. The semiconductor device 10 includes a base plate 12. An insulating substrate is provided on the base plate 12. The insulating substrate includes an insulating material 14, metal patterns 14a and 14b formed on a top surface of the insulating material 14, and a metal film 14c formed on a bottom surface of the insulating material 14. The insulating material 14 is made of a ceramic such as aluminum nitride (AlN), silicon nitride (SiN), or alumina ($Al_2O_3$), polymer resin, or the like. The metal film 14c is in contact with the base plate 12 with solder 16 interposed therebetween.

A semiconductor chip 20 is secured to the metal pattern 14a with, for example, solder. Examples of the material of the semiconductor chip 20 include, but not limited to, Si. The semiconductor chip 20 may be a switching element such as an IGBT or an MOSFET, or may be a diode. A plurality of semiconductor chips 20 may be provided. For example, six IGBTs and six diodes connected in anti-parallel to the IGBTs may be provided to form a three-phase AC inverter circuit. An electrode 22 is secured to the metal pattern 14b with, for example, solder. The electrode 22 is formed by machining a sheet material. The metal pattern 14b and a surface electrode of the semiconductor chip 20 are connected with a bonding wire 21. Thus, the electrode 22 is electrically connected to the semiconductor chip 20.

Figure 2:
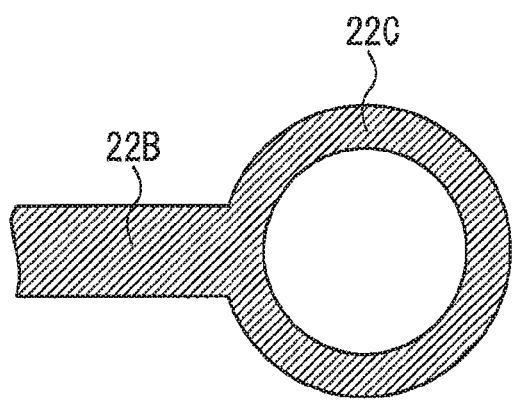
FIG. 2 is a plan view of the looped portion.

The electrode 22 has a secured portion 22A secured to the metal pattern 14b, an intermediate portion 22B continuous with the secured portion 22A, and a looped portion 22C continuous with the intermediate portion 22B. FIG. 2 is a plan view of the looped portion 22C. The looped portion 22C is circular in planar view. The shape of the looped portion 22C may be any looped shape, and not limited to a circular shape.

Referring back to FIG. 1, the semiconductor device 10 includes a cylindrical electrode 30. Examples of the material of the cylindrical electrode 30 include, but not limited to, metals such as SUS, Cu, and Al. The cylindrical electrode 30 has a main portion 30A, a narrow portion 30B continuous with the main portion 30A, and a wide portion 30C connected to the narrow portion 30B. The main portion 30A is located above the looped portion 22C. The narrow portion 30B is inserted into the looped portion 22C. The narrow portion 30B is surrounded by the looped portion 22C. The wide portion 30C is located below the looped portion 22C. The wide portion 30C is a portion formed by "swaging" a tip portion of the cylindrical electrode 30 so that the wide portion 30C may have a larger width than the narrow portion 30B. Moreover, "swaging" the tip portion of the cylindrical electrode 30 causes the looped portion 22C to be held between the wide portion 30C and the main portion 30A.

Figure 3:
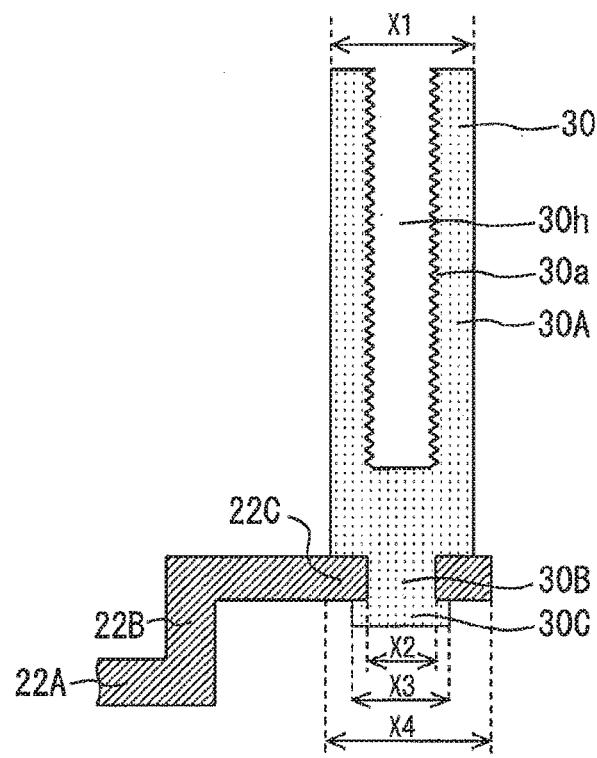

FIG. 3 is a cross-sectional view showing the cylindrical electrode 30 and the like. A screw thread 30a is formed in the main portion 30A. Specifically, a hole 30h is provided in the main portion 30A, and the screw thread 30a is provided in the hole 30h. The cylindrical electrode 30 is a nut which functions as a terminal. The width X2 of the narrow portion 30B is smaller than the width X1 of the main portion 30A. The width X3 of the wide portion 30C is larger than the width X2 of the narrow portion 30B. A top surface of the looped portion 22C is in contact with the main portion 30A. A bottom surface of the looped portion 22C is in contact with the wide portion 30C. Thus, the electrode 22 and the cylindrical electrode 30 are electrically connected. The outside diameter X4 of the looped portion 22C is preferably equal to or more than the width X1 of the main portion 30A. This provides a sufficient contact area between the looped portion 22C and the main portion 30A.

Figure 4:
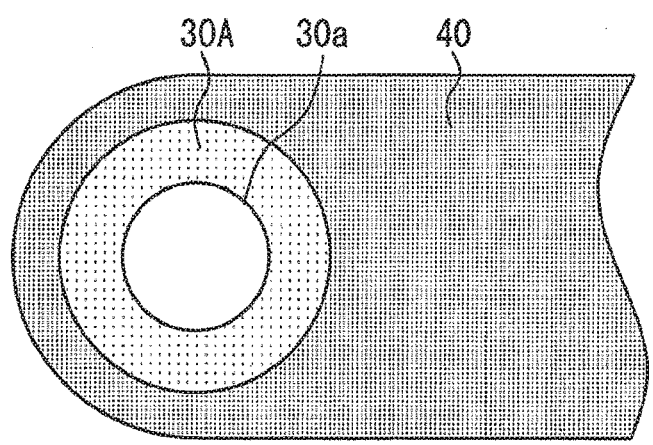

Referring back to FIG. 1, the semiconductor device 10 includes a case 40. The case 40 protects the semiconductor chip 20 and the electrode 22 from the external environment. The material of the case 40 is not limited to a particular material, but is preferably a resin such as PPS, a mixture of PET and PBT, PBT, or nylon. The case 40 is secured to the base plate 12 and is in contact with the main portion 30A. More specifically, the case 40 is in contact with a side wall of the main portion 30A but is not in contact with a top surface of the main portion 30A, the narrow portion 30B, the wide portion 30C, and the bottom surface of the looped portion 22C. Accordingly, an upper end and a lower end of the cylindrical electrode 30 are exposed from the case 40. FIG. 4 is a plan view showing the cylindrical electrode 30 and the like. Since the upper end of the main portion 30A is exposed from the case 40, the screw thread 30a is also exposed from the case 40.

Figure 5:
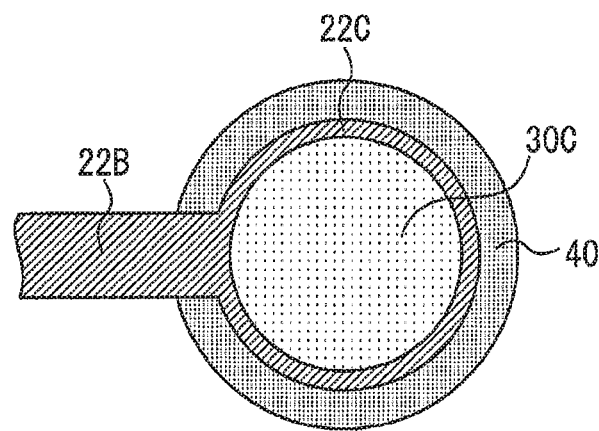

The electrode 22 is in contact with the case 40 only by the top surface of the looped portion 22C. The case 40 is not in contact with the bottom surface of the looped portion 22C. Thus, the connecting portion between the looped portion 22C and the cylindrical electrode 30 is exposed from the case 40. FIG. 5 is a bottom view showing the looped portion 22C, the cylindrical electrode 30, and the like. The outside diameter of the looped portion 22C is larger than the outside diameter of the wide portion 30C. The wide portion 30C has a circular shape.

Figure 6:
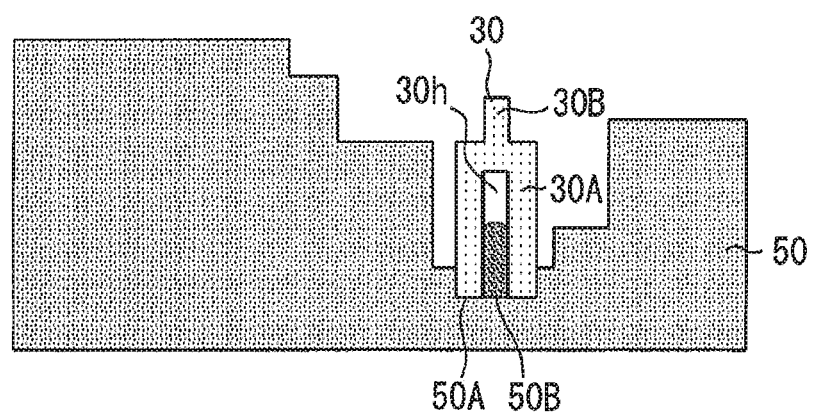
FIG. 6 is a cross-sectional view showing a lower mold half and the cylindrical electrode.

A method for manufacturing the semiconductor device 10 according to Embodiment 1 of the present invention will be described. First, a cylindrical electrode is placed on a lower mold half. FIG. 6 is a cross-sectional view showing a lower mold half 50 and the cylindrical electrode 30. The cylindrical electrode 30 having the main portion 30A and the narrow portion 30B is placed on the lower mold half 50. At this time, the cylindrical electrode 30 is preferably with a predetermined position by inserting an alignment pin 50B provided in a recessed portion 50A of the lower mold half 50 into the hole 30h of the cylindrical electrode 30. This brings the main portion 30A into contact with the lower mold half 50 and causes the hole 30h to be covered with the lower mold half 50. This step is referred to as a first preparation step. It should be noted that at this point of time, the cylindrical electrode 30 does not have a wide portion.

Figure 7:
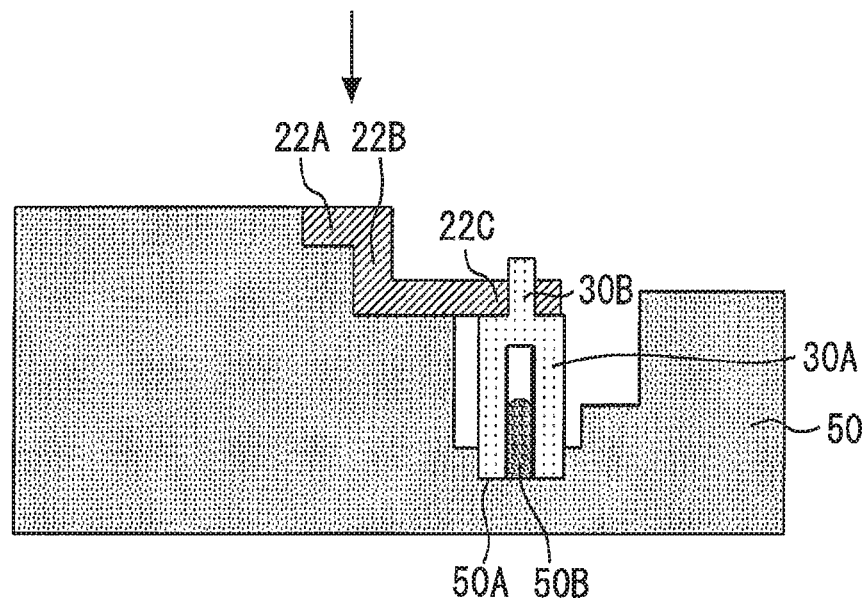

Subsequently, a second preparation step is performed. In the second preparation step, the electrode 22 having the looped portion 22C is placed on the lower mold half 50. FIG. 7 is a cross-sectional view showing the electrode 22 placed on the lower mold half 50 and the like. When the electrode 22 is placed on the lower mold half 50, part of the narrow portion 30B is placed in a space surrounded by the looped portion 22C. As is clear from FIG. 7, the narrow portion 30B is thicker than the electrode 22, and therefore only part of the narrow portion 30B is housed in the looped portion 22C. A portion of the narrow portion 30B which is not housed in the looped portion 22C protrudes from the looped portion 22C upward. The step of supplying the electrode 22 in this way is referred to as a second preparation step.

Figure 8:
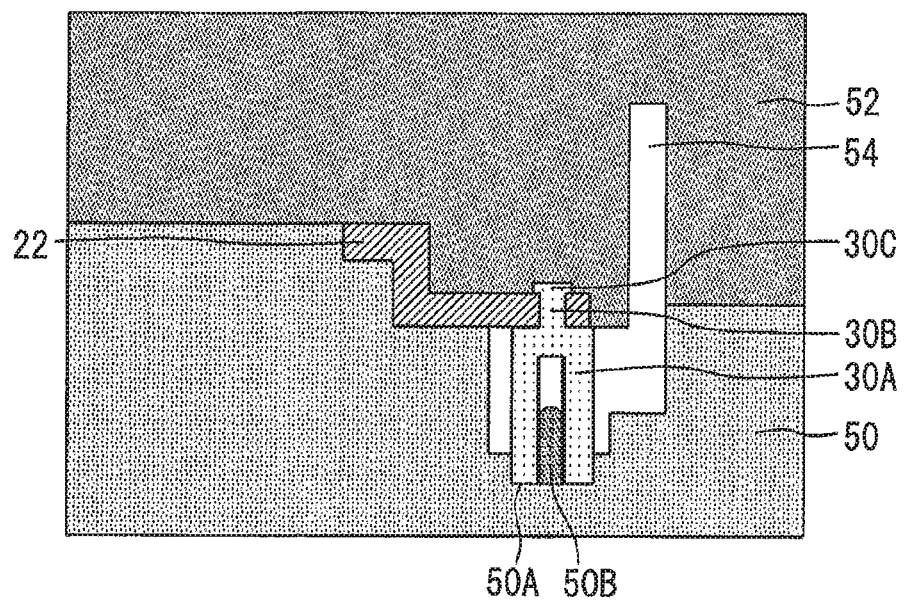

Subsequently, a mold clamping step is performed. In the mold clamping step, an upper mold half and the lower mold half are clamped together. FIG. 8 is a cross-sectional view showing an upper mold half 52 and the lower mold half 50 clamped together and the like. Mold clamping produces a cavity 54 surrounded by the upper mold half 52 and the lower mold half 50. This mold clamping compresses the tip of the narrow portion 30B of the cylindrical electrode 30 to form the wide portion 30C.

Figure 9:
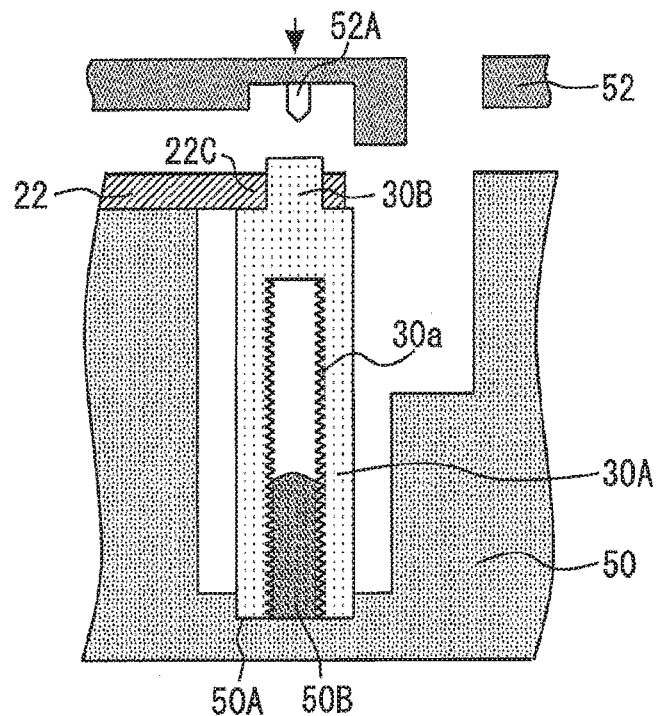
FIG. 9 shows a method for forming the wide portion.

Referring to FIG. 9, a method for forming the wide portion 30C will be described. The upper mold half 52 has a swaging pin 52A. When the upper mold half 52 and the lower mold half 50 are brought close to each other, the swaging pin 52A and the narrow portion 30B come in contact with each other. Then, pressure exerted by the upper mold half 52 and the lower mold half 50 at the time of mold clamping causes the swaging pin 52A to compress the portion of the narrow portion 30B which protrudes from the looped portion 22C. Thus, the protruding portion and the electrode 22 are swaged. As a result, the wide portion 30C spreading over the looped portion 22C is formed, and the electrode 22 and the cylindrical electrode 30 are mechanically secured. The formed wide portion 30C may have a flare-type swage structure or a punch-type swage structure. The step of performing mold clamping in this way is referred to as a mold clamping step.

Figure 10:
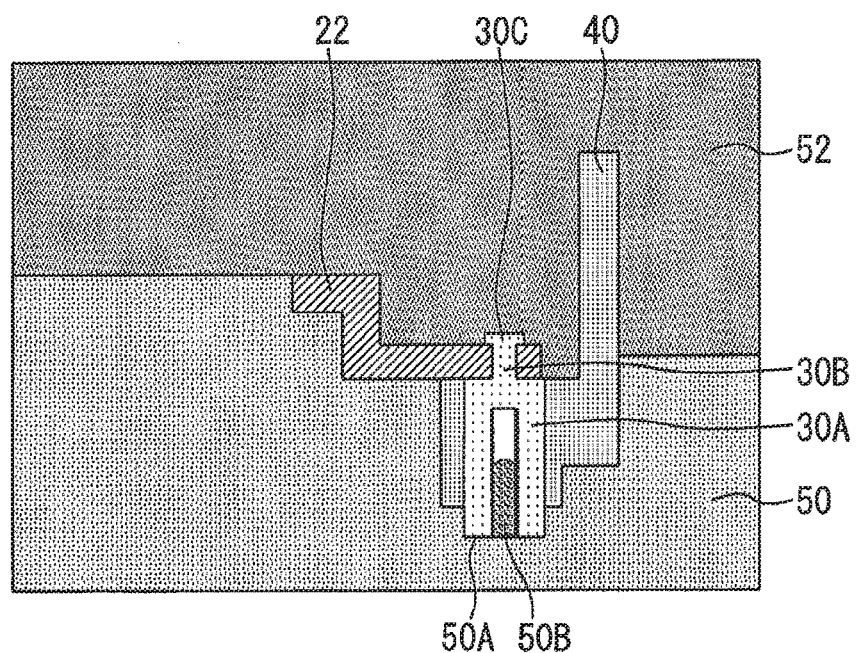
FIG. 10 is a cross-sectional view showing injected resin.

Subsequently, a resin injection step is performed. In the resin injection step, resin is injected into the cavity 54 formed by the upper mold half 52 and the lower mold half 50. FIG. 10 is a cross-sectional view showing injected resin. Injecting resin into a cavity surrounded by the upper mold half 52 and the lower mold half 50 produces the case 40. The case 40 is in contact with the side surface of the main portion 30A. Since the entire circumference of the wide portion 30C is covered with the upper mold half 52, resin is not supplied to the wide portion 30C formed by swaging and a portion of the electrode 22 which is in contact with the wide portion 30C. The upper mold half 52 and the electrode 22 surrounding the entire region in which the wide portion 30C is formed and thus forming an enclosed space, can prevent resin from being supplied to the wide portion 30C. To prevent resin from being supplied to the wide portion 30C, the upper mold half 52 is preferably in contact with the entire circumference of the wide portion 30C. The step of forming the case 40 by insert molding in this way is referred to as a resin injection step. Forming the case 40 by insert molding makes it possible to prevent the case 40 from contacting the narrow portion 30B, the wide portion 30C, and the top surface of the looped portion 22C while causing the case 40 to contact the side wall of the main portion 30A.

Figure 11:
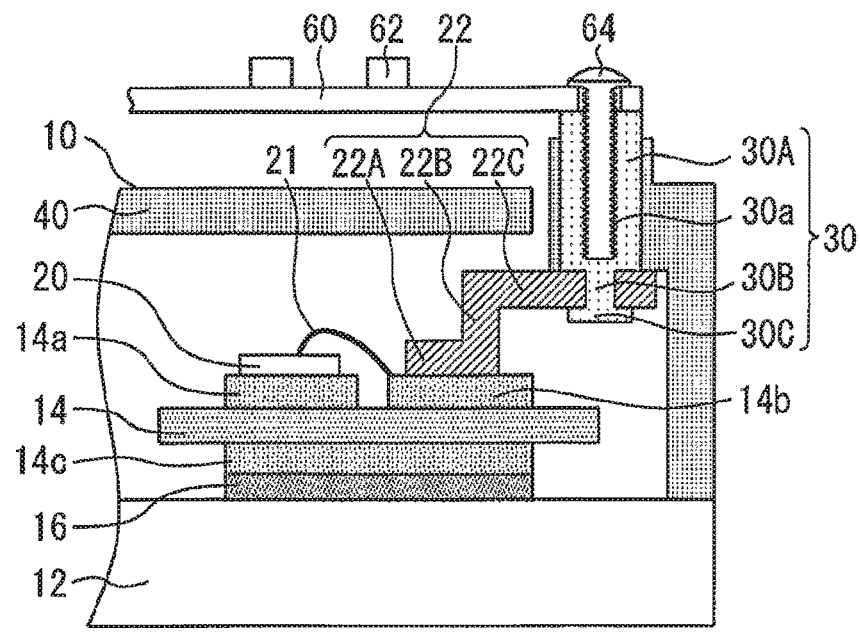
FIG. 11 is a view showing a usage example of the semiconductor device.

FIG. 11 is a view showing a usage example of the semiconductor device 10 according to Embodiment 1 of the present invention. A screw 64 is screwed into the screw thread 30a of the cylindrical electrode 30 to secure the control board 60 to the cylindrical electrode 30. A semiconductor device 62 is provided on the control board 60. The cylindrical electrode 30 and the semiconductor device 62 are electrically connected with, for example, an interconnection pattern provided on the control board 60 and the screw 64. This enables a control signal to be sent from the control board 60 to the semiconductor chip 20 and enables an output of the semiconductor chip 20 to be taken.

In the semiconductor device according to Embodiment 1 of the present invention, electrical connection between the semiconductor device 10 and the outside thereof is realized using the cylindrical electrode 30. Accordingly, bending an electrode outside the device is not required. Using the cylindrical electrode 30 can reduce metal exposed on the outside of the case 40. Accordingly, the semiconductor device 10 according to Embodiment 1 of the present invention is suitable for miniaturization. Further, connection between the cylindrical electrode 30 and the electrode 22 is realized by "swaging" using clamping pressure at the time of mold clamping as described above. Accordingly, complicated wiring within the case 40 is not required. Thus, a method for manufacturing the semiconductor device 10 according to Embodiment 1 is very simple and can improve productivity.

Since the device is subjected to heat of around 100° C. when the case 40 is molded, the expansion and contraction of metal may cause misalignment and the like. To detect a trouble such as misalignment, it is desirable that the connecting portion between the wide portion 30C and the electrode 22 can be visually examined after the case 40 is molded. Accordingly, in Embodiment 1 of the present invention, the connecting portion between electrode 22 and the cylindrical electrode 30 is not covered with the case 40. Accordingly, the finish of the junction can be examined after the case 40 is molded, and the stability of quality can be improved. After the exposed connecting portion is examined, gel may be injected into the case 40 to cause the gel to stick to the connecting portion. Since the contact between gel and metal is stronger than the contact between resin and metal, it is expected that using gel improves insulating properties of the device.

While the semiconductor chip 20 made of Si has been described in the above-described embodiment, the semiconductor chip 20 may be made of a wide bandgap semiconductor having a larger bandgap than Si. Examples of wide bandgap semiconductors include silicon carbide, gallium nitride materials, and diamond. The semiconductor chip 20 may be, for example, a SiC-MOSFET or a SiC-SBD (Schottky Barrier Diode) using silicon carbide. The semiconductor chip 20 made of such a wide bandgap semiconductor has excellent voltage endurance and high allowable current density, and therefore can be miniaturized. Using the miniaturized semiconductor chip 20 makes it possible to also miniaturize a semiconductor device into which the semiconductor chip 20 is incorporated.

Moreover, since the semiconductor chip 20 made of a wide bandgap semiconductor also has excellent heat resistance, radiation fins of a heatsink can be miniaturized, and a water-cooled portion can be changed to an air-cooled portion. Accordingly, the semiconductor device 10 as part of a module can be further miniaturized.

Furthermore, since the power loss of the semiconductor chip 20 made of a wide bandgap semiconductor is small, the efficiency of a switching element or a diode can be improved. Accordingly, the efficiency of the semiconductor device 10 as part of a module can be improved.

Generally, the semiconductor device 10 contains a plurality of semiconductor chips 20. One or several of the plurality of semiconductor chips 20 may be made of a wide bandgap semiconductor, and effects of this embodiment can be obtained.

As described above, by employing the semiconductor chip 20 made of a wide bandgap semiconductor, a semiconductor device suitable for miniaturization can be provided. However, a semiconductor device of a type in which an electrode extending to the outside is bent is difficult to miniaturize in line with the performance of the wide bandgap semiconductor, because of package constraints, such as a sufficient insulating distance and internal wiring implementation. On the other hand, in Embodiment 1 of the present invention, using the cylindrical electrode 30 enables the package side to be miniaturized, and therefore miniaturization which takes advantage of the performance of a wide bandgap semiconductor can be realized. Using a wide bandgap semiconductor can realize high-temperature operation and high-speed operation, and therefore a cooler and a control circuit around the semiconductor device 10 can also be miniaturized.

Figure 12:
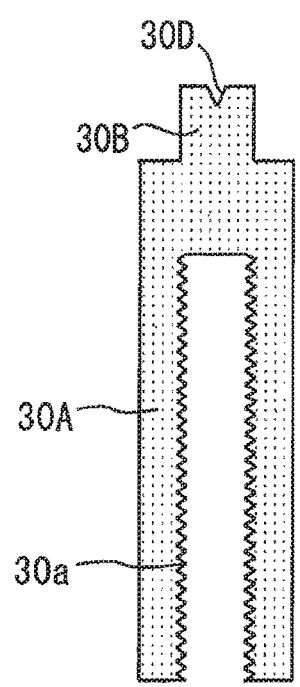
FIG. 12 is a cross-sectional view of the cylindrical electrode according to a modified example.

The semiconductor device 10 according to Embodiment 1 can be variously modified within a range in which features thereof are not lost. FIG. 12 is a cross-sectional view of the cylindrical electrode 30 according to a modified example. The cylindrical electrode 30 shown in FIG. 12 is a cylindrical electrode before the above-described swaging using a swaging pin is performed. A portion which is compressed by the swaging pin to become a wide portion has the shape of a countersink. Specifically, a countersink portion 30D is provided in the tip of the narrow portion 30B. The countersink portion 30D is a recessed portion provided in the top surface of the narrow portion 30B. A wide portion can be easily formed by pressing the swaging pin against the countersink portion 30D in the mold clamping step. While an explanation to the effect that the wide portion 30C is formed by using the swaging pin 52A has been made in Embodiment 1, the wide portion 30C may be formed without using the swaging pin 52A. For example, the wide portion 30C spreading over the looped portion 22C may be formed as follows: in the mold clamping step, the upper mold half 52 and the lower mold half 50 are clamped together, and a portion of the narrow portion 30B which protrudes from the looped portion 22C upward is compressed by the upper mold half 52.

By providing the looped portion 22C which has a "looped shape" in planar view, the contact area between the looped portion 22C and the wide portion 30C can be sufficiently ensured. Accordingly, the shape of the looped portion 22C only needs to be a looped shape in planar view, and does not need to be a circular shape in planar view but may be other shape. In the resin injection step, by preventing resin from being supplied to the wide portion 30C, the state of connection between the wide portion 30C and the electrode 22 is made capable of being visually examined. However, in the case where such an examination is omitted, resin which comes in contact with the wide portion 30C may be supplied.

The modified examples described in Embodiment 1 can be applied to semiconductor devices and semiconductor device manufacturing methods according to embodiments below. It should be noted that the semiconductor devices and the semiconductor device manufacturing methods according to the embodiments below have many things in common with those of Embodiment 1, and therefore differences from Embodiment 1 will be mainly described.

Embodiment 2

Figure 13:
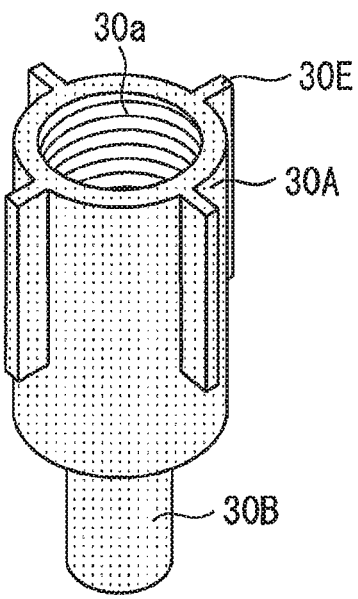
FIG. 13 is a perspective view of a cylindrical electrode of a semiconductor device according to Embodiment 2.

FIG. 13 is a perspective view of a cylindrical electrode 30 of a semiconductor device according to Embodiment 2. The cylindrical electrode 30 has ribs 30E on the side surface of the main portion 30A. The ribs 30E protrude from the side surface of the main portion 30A. The ribs 30E are formed along the longitudinal direction of the main portion 30A.

Figure 14:
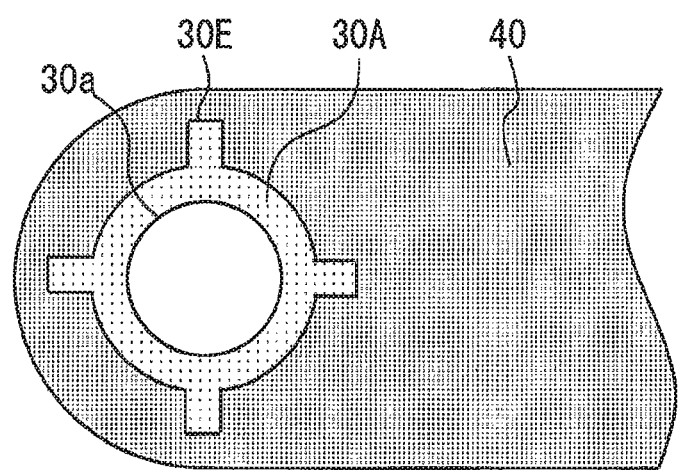
FIG. 14 is a plan view showing the cylindrical electrode and the case.

FIG. 14 is a plan view showing the cylindrical electrode 30 and the case 40 according to Embodiment 2. Resin which covers the ribs 30E is supplied by insert molding, and the resin is formed into the case 40. The case 40 is in contact with the side surface of the main portion 30A and covers the ribs 30E. The cylindrical electrode 30 is secured to the case 40 by insert molding.

In the semiconductor device according to Embodiment 2, the ribs 30E are provided, and the ribs 30E are covered with the case 40. Accordingly, compared to the case where the ribs 30E are not provided, the contact area between the cylindrical electrode 30 and the case 40 increases. By providing the ribs 30E, the case 40 is more firmly secured to the cylindrical electrode 30. Accordingly, for example, a tightening torque to secure an external interconnection to the cylindrical electrode 30 with a screw can be increased. The number of ribs 30E and the shapes thereof are not particularly limited as long as the above-described effect can be obtained. For example, knurling may be performed on the side surface of the main portion 30A to prevent the cylindrical electrode 30 from rotating with respect to the case 40. Protrusions formed by knurling are examples of ribs.

Embodiment 3

Figure 15:
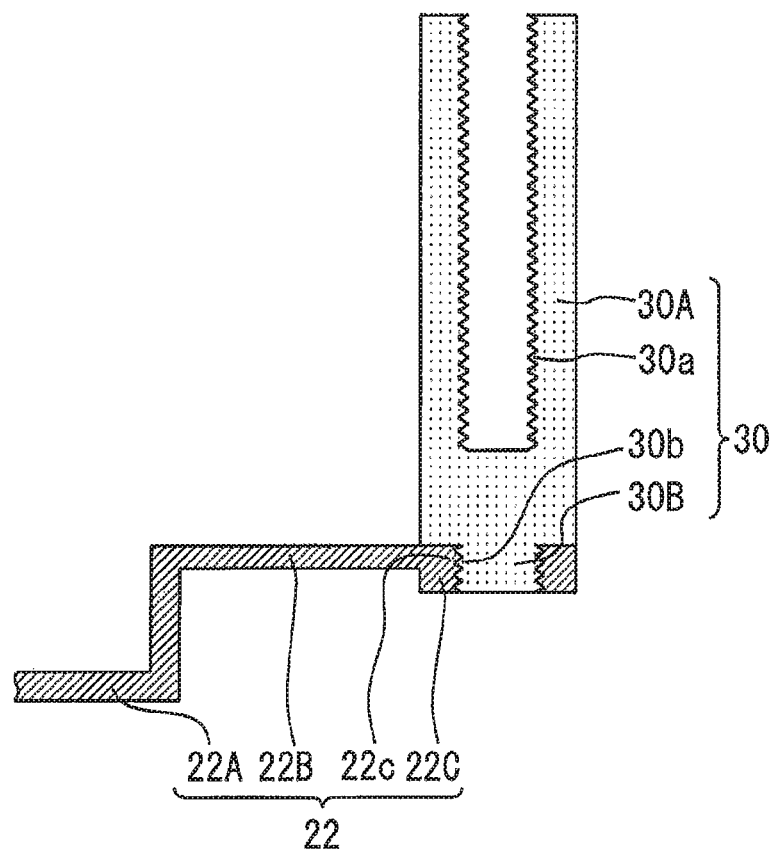
FIG. 15 is a cross-sectional view showing the cylindrical electrode and the electrode according to Embodiment 3.

FIG. 15 is a cross-sectional view showing the cylindrical electrode 30 and the electrode 22 according to Embodiment 3. The cylindrical electrode 30 has the main portion 30A and the narrow portion 30B, but does not has the wide portion 30C. The side wall of the narrow portion 30B has a screw thread 30b. The inside wall of the looped portion 22C also has a screw thread 22c. By screwing the narrow portion 30B and the looped portion 22C together, the inside wall of the looped portion 22C comes in contact with the narrow portion 30B, and the electrode 22 is electrically connected to the cylindrical electrode 30. Then, in the second preparation step, in a state in which the narrow portion 30B and the looped portion 22C are screwed together, the electrode 22 is placed on the lower mold half 50.

In the case where the electrode 22 has a certain amount of thickness, forming a screw thread on the inside wall of the looped portion 22C provides a screw thread having a sufficient length. However, in the case where the electrode 22 is relatively thin, a screw thread having a sufficient length cannot be formed on the inside wall of the looped portion 22C. In that case, burring is preferably performed on the electrode 22. Burring is machining that forms a flange at the edge of a hole.

Figure 16:
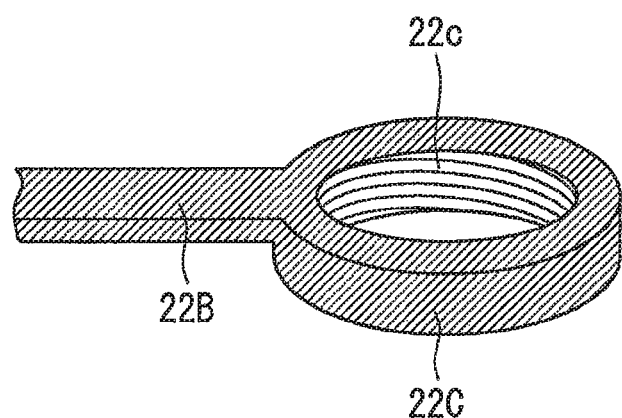
FIG. 16 is a perspective view of the looped portion subjected to burring.

FIG. 16 is a perspective view of the looped portion 22C subjected to burring. Burring makes the looped portion 22C thicker than the intermediate portion 22B. By forming the screw thread 22c in the thick looped portion 22C, the screw thread 22c having a sufficient length can be provided.

Embodiment 4

Figure 17:
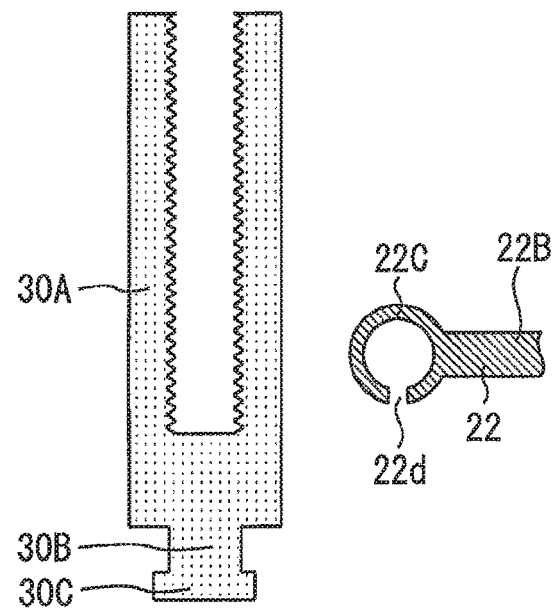
FIG. 17 shows cylindrical electrode and the electrode according to embodiment 4.

FIG. 17 includes a cross-sectional view of the cylindrical electrode 30 according to Embodiment 4 and a plan view of the electrode 22. The wide portion 30C of the cylindrical electrode 30 according to Embodiment 4 is not formed by the mold clamping step but originally provided in the cylindrical electrode 30. The shape of the looped portion 22C of the electrode 22 is not a complete circle, and partially broken to provide an open portion 22d. The electrode 22 provided with such an open portion 22d is secured to the narrow portion 30B of the cylindrical electrode 30 by snap fit.

Figure 18:
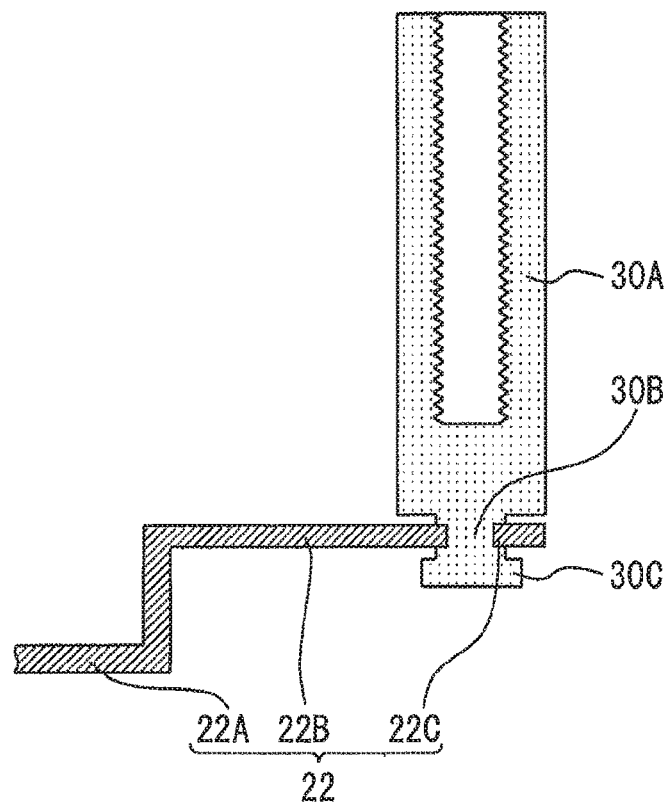
FIG. 18 is a cross-sectional view showing the cylindrical electrode and the electrode.

FIG. 18 is a cross-sectional view showing the cylindrical electrode 30 and the electrode 22 secured to the cylindrical electrode 30. The inside wall of the looped portion 22C is in contact with the narrow portion 30B by snap fit. This securing by snap fit is performed in the second preparation step. Specifically, when the electrode 22 is placed on the lower mold half 50, the looped portion 22C of the electrode 22 is fitted to the narrow portion 30B so that the looped portion 22C may tightly grip the narrow portion 30B, thus realizing snap fit. In this way, the electrode 22 can be easily secured and electrically connected to the cylindrical electrode 30.

In all of Embodiments 1 to 4, as shown in FIG. 3, the outside diameter X4 of the looped portion 22C is preferably equal to or more than the outside diameter X1 of the main portion 30A. In Embodiments 1 and 4, the outside diameter X4 of the looped portion 22C is preferably more than the outside diameter X3 of the wide portion. By setting the outside diameter X4 of the looped portion 22C to a certain amount of length, the contact area between the looped portion 22C and the main portion 30A can be ensured. The diameters X1, X2, and X3 in FIG. 3 are "outside diameters" if the two-dimensional shapes of the main portion 30A, the narrow portion 30B, and the wide portion 30C are circular, but are "widths" if non-circular. Similarly, X4 in FIG. 3 is an "outside diameter" if the looped portion 22C is circular, but is a "width" if non-circular. It should be noted that features of the semiconductor devices and the semiconductor device manufacturing methods according to the embodiments described above may be combined. For example, the cylindrical electrode 30 in FIG. 3, 15, or 17 may be provided with ribs.

In accordance with the present invention, a narrow portion of a cylindrical electrode is inserted through and electrically connected to an inside of a looped portion formed in an electrode, and the cylindrical electrode is exposed from the case. Thus, a semiconductor device which is suitable for miniaturization and which can be easily manufactured can be provided.

Many modifications and variations of the present invention are possible in the light of the above teachings. It is therefore to be understood that within the scope of the appended claims variations may be practiced otherwise than as specifically described.

What is claimed is:

1. A semiconductor device comprising:
   a semiconductor chip;
   an electrode electrically connected to the semiconductor chip, the electrode including a looped portion;
   a cylindrical electrode including a main portion having a screw thread formed therein and a narrow portion continuous with the main portion, the narrow portion having a smaller width than the main portion, the cylindrical electrode being electrically connected to the electrode by the narrow portion being inserted into the looped portion; and
   a case for the semiconductor chip and the electrode, the case contacting the main portion and a top surface of the looped portion, while causing the screw thread and a connecting portion between the looped portion and the cylindrical electrode to be exposed.

2. The semiconductor device according to claim 1, wherein an inside wall of the looped portion contacts the narrow portion.

3. The semiconductor device according to claim 1, wherein
   the cylindrical electrode includes a wide portion which is connected to the narrow portion and has a larger width than the narrow portion, and
   the top surface of the looped portion contacts the main portion, and a bottom surface of the looped portion contacts the wide portion.

4. The semiconductor device according to claim 3, wherein an outside diameter of the looped portion is larger than an outside diameter of the wide portion.

5. The semiconductor device according to claim 1, wherein the looped portion is circular in planar view.

6. The semiconductor device according to claim 1, wherein an outside diameter of the looped portion is equal to or more than a width of the main portion.

7. The semiconductor device according to claim 1, wherein
   the cylindrical electrode has a rib on a side surface of the main portion, and
   the case covers the rib.

8. The semiconductor device according to claim 1, wherein a screw thread is formed on a side wall of the narrow portion, a screw thread is formed on an inside wall of the looped portion, and the narrow portion and the looped portion are screwed together.

9. The semiconductor device according to claim 1, wherein the narrow portion and the looped portion are in contact with each other by snap fit.

10. The semiconductor device according to claim 1, wherein the semiconductor chip is made of a wide bandgap semiconductor.

11. The semiconductor device according to claim 10, wherein the wide bandgap semiconductor is any one of silicon carbide, a gallium nitride material, and diamond.

* * * * *